(12) United States Patent
Kinoshita et al.

(10) Patent No.: US 7,863,623 B2
(45) Date of Patent: *Jan. 4, 2011

(54) SEMICONDUCTOR LIGHT EMITTING DEVICE

(75) Inventors: Yoshitaka Kinoshita, Kagoshima (JP); Hidenori Kamei, Fukuoka (JP)

(73) Assignee: Panasonic Corporation, Osaka (JP)

(*) Notice: Subject to any disclaimer, the term of this patent is extended or adjusted under 35 U.S.C. 154(b) by 226 days.

This patent is subject to a terminal disclaimer.

(21) Appl. No.: 12/066,465

(22) PCT Filed: Sep. 12, 2006

(86) PCT No.: PCT/JP2006/318075
§ 371 (c)(1),
(2), (4) Date: Mar. 11, 2008

(87) PCT Pub. No.: WO2007/032355
PCT Pub. Date: Mar. 22, 2007

(65) Prior Publication Data
US 2009/0267091 A1  Oct. 29, 2009

(30) Foreign Application Priority Data
Sep. 15, 2005  (JP) .............. 2005-267853
Sep. 15, 2005  (JP) .............. 2005-267854
Sep. 15, 2005  (JP) .............. 2005-267855

(51) Int. Cl.
*H01L 31/0256* (2006.01)
(52) U.S. Cl. .............. 257/76; 257/79; 257/103; 257/E33.003; 257/E33.005; 257/E33.008
(58) Field of Classification Search .......... 257/79, 257/103, E33.003, E33.005, E33.008, 76
See application file for complete search history.

(56) References Cited

U.S. PATENT DOCUMENTS

| 5,804,834 | A | 9/1998 | Shimoyama et al. |
| 6,858,882 | B2 | 2/2005 | Tsuda et al. |
| 7,601,985 | B2 * | 10/2009 | Kinoshita et al. .......... 257/76 |
| 2002/0054617 | A1 | 5/2002 | Tsuda et al. |

(Continued)

FOREIGN PATENT DOCUMENTS

JP  8-70139  3/1996

(Continued)

OTHER PUBLICATIONS

U.S. Appl. No. 10/593,446, filed Sep. 19, 2006, Kinoshita et al.

(Continued)

*Primary Examiner*—Long K Tran
(74) *Attorney, Agent, or Firm*—McDermott Will & Emery LLP

(57) ABSTRACT

A semiconductor light emitting device includes a substrate 11 including a group III-V nitride semiconductor; a first-conductivity-type layer 12 formed on the substrate 11, the first-conductivity-type layer including a plurality of group III-V nitride semiconductor layers of first conductivity type; an active layer 13 formed on the first semiconductor layer 12; and a second-conductivity-type layer 14 formed on the active layer 13, the second-conductivity-type layer including a group III-V nitride semiconductor layer of second conductivity type. The first-conductivity-type layer 12 includes an intermediate layer 23 made of $Ga_{1-x}In_xN$ ($0<x<1$).

6 Claims, 4 Drawing Sheets

U.S. PATENT DOCUMENTS

| | | | |
|---|---|---|---|
| 2002/0056836 A1* | 5/2002 | Sawazaki et al. | 257/13 |
| 2004/0056259 A1* | 3/2004 | Goto et al. | 257/79 |
| 2007/0057282 A1 | 3/2007 | Kinoshita et al. | |
| 2009/0236585 A1* | 9/2009 | Ueta et al. | 257/14 |
| 2009/0321745 A1* | 12/2009 | Kinoshita et al. | 257/76 |

FOREIGN PATENT DOCUMENTS

| | | |
|---|---|---|
| JP | 08-213653 | 8/1996 |
| JP | 2000-223743 | 8/2000 |
| JP | 2001-60719 | 3/2001 |
| JP | 2001-127382 | 5/2001 |
| JP | 2002-084041 A | 3/2002 |
| JP | 2002-94189 | 3/2002 |
| JP | 2005-268581 | 9/2005 |
| JP | 2007-81180 | 3/2007 |

OTHER PUBLICATIONS

Japanese Office Action, with English translation, issued in Japanese Patent Application No. 2005-267853, mailed Apr. 13, 2010.

Japanese Office Action, with English translation, issued in Japanese Patent Application No. 2005-267854, mailed Apr. 13, 2010.

Japanese Notice of Reasons for Rejection, w/ English translation thereof, issued in Japanese Patent Application No. JP 2005-267855 dated Sep. 28, 2010.

Japanese Notice of Reasons for Rejection, w/ English translation thereof, issued in Japanese Patent Application No. JP 2005-267854 dated Sep. 28, 2010.

Japanese Notice of Reasons for Rejection, w/ English translation thereof, issued in Japanese Patent Application No. JP 2005-267853 dated Sep. 28, 2010.

* cited by examiner

SEMICONDUCTOR LIGHT EMITTING DEVICE

RELATED APPLICATIONS

This application is the U.S. National Phase under 35 U.S.C. §371 of International Application No. PCT/JP2006/318075, filed on Sep. 12, 2006, which in turn claims the benefit of Japanese Application Nos. 2005-267853, 2005-267854, and 2005-267855, all three of them filed on Sep. 15, 2005, the disclosures of which Applications are incorporated by reference herein.

TECHNICAL FIELD

The present invention relates to a semiconductor light emitting device. Specifically, the present invention relates to a semiconductor light emitting device including a group III-V nitride semiconductor.

BACKGROUND ART

In recent years, a group III-V nitride semiconductor expressed by a general formula $Al_xGa_{1-x-y}In_yN$ ($0 \leq x \leq 1$, $0 \leq y \leq 1$, $x+y \leq 1$) has been widely used as a semiconductor material for a light emitting device which operates within a wavelength band ranging from the visible wavelength to the ultraviolet wavelength and for an electronic device which operates at high power and at high temperature.

When a semiconductor light emitting device made of the group III-V nitride semiconductor is formed on a sapphire substrate, an intermediate layer made of GaInN is generally formed between the substrate and an active layer in order to suppress propagation of a crystal defect to the active layer, the crystal defect being caused by a lattice mismatch between the substrate and a group III-V nitride semiconductor layer (for example, see Patent Document 1).

Meanwhile, as a substrate used for a light emitting device made of a group III nitride semiconductor, a conductive substrate such as a GaN substrate has been used as an alternative to an insulating substrate such as a sapphire substrate.

When the conductive substrate is used, a current can be conducted through the substrate to lower the resistance value of a current path, which allows electric power consumption and the operating voltage to be reduced. Moreover, the electrostatic withstand voltage can be enhanced.

FIG. 6 shows an example of a conventional semiconductor light emitting device using the GaN substrate. In FIG. 6, on a GaN substrate 111, an n-type GaN layer 102, a GaInN active layer 106, and a p-type GaN layer 112 are sequentially stacked.

On the p-type GaN layer 112, a p-side electrode 109 is formed. Parts of the p-type GaN layer 112, the GaInN active layer 106, and the n-type GaN layer 102 are removed to expose part of the n-type GaN layer 102. On the exposed part of the n-type GaN layer 102, an n-side electrode 110 is formed (for example, see Patent Document 2).

The lattice mismatch ratio is smaller between a GaN substrate and a group III nitride semiconductor layer formed on the GaN substrate than between a sapphire substrate and a group III nitride semiconductor layer formed on the sapphire substrate. Therefore, the group III nitride semiconductor layer formed on the GaN substrate has few defects caused by the lattice mismatch, and thus there is no need to suppress the propagation of the crystal defect caused by the lattice mismatch with the substrate. Moreover, since an intermediate layer made of GaInN grown at low temperature may also be a cause of a crystal defect which is naturally produced during the growth, the intermediate layer made of GaInN which is lattice-mismatched with the GaN substrate is not formed.

[Patent Document 1] Japanese Laid-Open Patent Publication No. 8-70139

[Patent Document 2] Japanese Laid-Open Patent Publication No. 2001-60719

DISCLOSURE OF INVENTION

Problems to be Solved by the Invention

However, when the GaN substrate is used, a new problem arises that variations in characteristics between devices are caused by an off angle distribution variation and a surface treatment variation which are specific to the GaN substrate.

Moreover, unlike the case where crystals are grown by step flow, on a GaN substrate whose principal surface has an off angle of less than 0.3° from the (0001) plane, a number of crystals each of which has a six-sided pyramidal surface morphological profile are grown, and thus the smoothness of the substrate considerably deteriorates. Therefore, a crystal structure of the semiconductor layer formed on the GaN substrate having the off angle of less than 0.3° is unstable. This results in a problem that the photoluminescence intensity of a semiconductor light emitting device is extremely lowered.

Meanwhile, when crystal growth of a semiconductor layer on a substrate is performed by metal organic chemical vapor deposition (MOCVD) or the like, a gas stream in a MOCVD apparatus lowers the temperature of a crystal growth surface, which may alter the shape of the substrate into a concave shape toward the crystal growth surface. In the case of the sapphire substrate, since the lattice mismatch ratio between the substrate and the semiconductor layer is great, a force which is to alter the shape into a convex shape toward the crystal growth surface form the sapphire substrate is exerted. Therefore, the sapphire substrate is brought back to be an almost flat shape, and thus there is no problem relating to a warp of the substrate which occurs during the crystal growth. However, in the case of the GaN substrate, since the lattice mismatch ratio between the substrate and the semiconductor layer is small, the force which is to alter the shape of the substrate into a convex shape is not exerted, and thus the substrate are likely to be warped into a concave shape. As a result, there is a problem that characteristics between semiconductor light emitting devices formed on the substrate may greatly vary.

An object of the present invention is to realize semiconductor light emitting devices having stable characteristics wherein the above-mentioned conventional problem is solved, and variations between the semiconductor light emitting devices formed on a substrate made of a group III-V nitride semiconductor are suppressed.

Means for Solving the Problems

To achieve the above-mentioned object, a semiconductor light emitting device according to the present invention is configured to have an intermediate layer containing In.

Specifically, a semiconductor light emitting device according to the present invention includes: a substrate made of a group III-V nitride semiconductor; a first-conductivity-type layer formed on the substrate, the first-conductivity-type layer including a plurality of group III-V nitride semiconductor layers of first conductivity type; an active layer formed on the first-conductivity-type layer; and a second-conductivitytype layer formed on the active layer, the second-conductivity-type layer being made of a group III-V nitride semiconductor layer of second conductivity type; wherein the first-conductivity-type layer includes an intermediate layer made of $Ga_{1-x}In_xN$ (0<x<1).

According to the semiconductor light emitting device of the present invention, the intermediate layer made of $Ga_{1-x}In_xN$ (0<x<1) is provided, and thus it is possible to reduce influence on the semiconductor layers exerted by six-sided pyramid shaped concavities and convexities formed on a surface of a substrate made of a group III-V nitride semiconductor. Therefore, it becomes possible to stably form the semiconductor layers on the substrate. This suppresses variations in light emitting characteristics between semiconductor light emitting devices, allowing the semiconductor light emitting devices having stable characteristics to be realized.

In the semiconductor light emitting device of the present invention, it is preferable that part of the first-conductivity-type layer, the active layer, and the second-conductivity-type layer form a mesa portion, and the part of the first-conductivity-type layer which forms the mesa portion includes the intermediate layer.

Alternatively, in the semiconductor light emitting device of the present invention, part of the first-conductivity-type layer, the active layer, and the second-conductivity-type layer may form a mesa portion, and the part of the first-conductivity-type layer which forms the mesa portion may be a part excepting at least the intermediate layer. In this case, it is preferable that the intermediate layer is in contact with the substrate.

In the semiconductor light emitting device of the present invention, it is preferable that the intermediate layer has a thickness of 10-500 nm.

In the semiconductor light emitting device of the present invention, it is preferable that a principal surface of the substrate is a (0001) plane.

In the semiconductor light emitting device of the present invention, it is preferable that a principal surface of the substrate has an off angle of 0.3-5° from a (0001) plane.

In the semiconductor light emitting device of the present invention, it is preferable that a principal surface of the substrate has an off angle of less than 0.3° from a (0001) plane, and the intermediate layer has a thickness of 50-500 nm.

Effects of the Invention

According to semiconductor light emitting devices of the present invention, it is possible to suppress variations between the semiconductor light emitting devices formed on a substrate made of a group III-V nitride semiconductor, so that the semiconductor light emitting devices having stable characteristics can be realized.

BRIEF DESCRIPTION OF DRAWINGS

FIGS. 2A and 2B are graphs illustrating the relationship between the photoluminescence intensity of semiconductor light emitting devices and formation positions of the semiconductor light emitting devices in a substrate, wherein FIG. 2A is the case where an intermediate layer made of InGaN is provided, and FIG. 2B is the case where the intermediate layer is not formed.

DESCRIPTION OF REFERENCE NUMERALS

Figure 1:
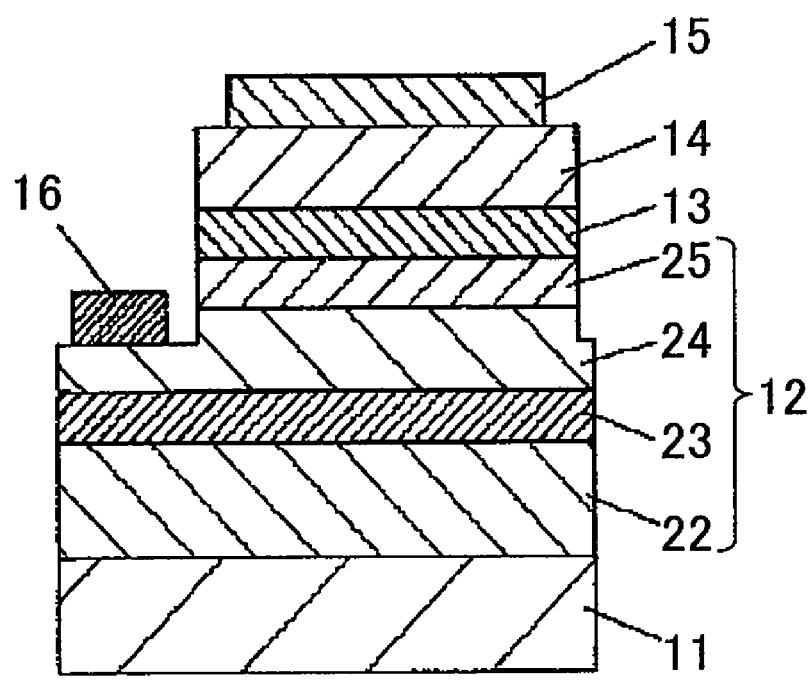
FIG. 1 is a cross-sectional view illustrating a semiconductor light emitting device according to an embodiment of the present invention.

11 Substrate
12 n-type Layer
13 Active Layer
14 p-type Layer
15 p-side Electrode
16 n-side Electrode
22 First n-type Layer
23 Intermediate Layer
24 Second n-type Layer
25 Cladding Layer Best Mode For Carrying Out The Invention An embodiment of the present invention will be described with reference to the drawings. FIG. 1 shows a cross-sectional configuration of a semiconductor light emitting device according to an embodiment. As shown in FIG. 1, over a substrate 11 made of GaN, an n-type layer 12, an active layer 13, and a p-type layer 14 are formed. The n-type layer 12 is formed of, from bottom to top, a first n-type layer 22 made of GaN doped with Si, an intermediate layer 23 made of $Ga_{1-x}In_xN$ (0<x<1) doped with Si, a second n-type layer 24 made of GaN doped with Si, and a cladding layer 25 made of undoped AlGaN.

The active layer 13 has a multiple quantum well structure in which barrier layers made of undoped GaN and well layers made of undoped InGaN are alternately stacked. The p-type layer 14 is formed of an AlGaN layer doped with Mg. The p-type layer 14, the active layer 13, the cladding layer 25 of the n-type layer 12, and part of the second n-type layer 24 of the n-type layer 12 are removed to form a mesa portion and to expose part of the second n-type layer 24. On the p-type layer 14, a p-side electrode 15 is formed. On the exposed part of the second n-type layer 24, an n-side electrode 16 is formed. A specific example of the composition, the thickness, and the like of respective semiconductor layers is shown in Table 1.

TABLE 1

| | Al composition | In composition | thickness | dopant | impurity concentration (cm$^{-3}$) | others |
|---|---|---|---|---|---|---|
| GaN substrate 11 | 0 | 0 | 300 μm | — | | |
| first n-type layer 22 | 0 | 0 | 1 μm | Si | $5 \times 10^{18}$ | |
| intermediate layer 23 | 0 | x | 10-500 nm | Si | $5 \times 10^{18}$ | |
| second n-type layer 24 | 0 | 0 | 500 nm | Si | $5 \times 10^{18}$ | |
| cladding layer 25 | 0.05 | 0 | 20 nm | undoped | — | |
| active layer 13 — barrier layer | 0 | 0 | 16 nm | undoped | — | Four well layers and three barrier layers are alternately formed on a one-by-one basis. |
| active layer 13 — well layer | 0 | 0.06 | 2 nm | undoped | — | |
| p-type layer 14 | 0.05 | 0 | 100 nm | Mg | $1 \times 10^{20}$ | |

It is to be noted that the p-side electrode 15 is a gold-based reflecting electrode having a thickness of 1 μm, and the n-side electrode 16 is a gold-based contact electrode having a thickness of 1 μm. The second n-type layer 24 has a thickness of 500 nm under the n-side electrode 16.

In the present embodiment, a plurality of semiconductor light emitting devices are formed on a GaN substrate having a diameter of 2 inch and a thickness of 300 μm, and then the semiconductor light emitting devices each of which has a planar dimension of 300 μm×300 μm are cut from the substrate. A principal surface of the substrate may have any plane orientation, but it is preferable that the plane orientation has an off angle of 0.3°-5° from the (0001) plane. Since the principal surface has an off angle, the activation ratio of a p-type impurity in the p-type layer 14 increases, allowing the operating voltage to be reduced. When the off angle is greater than or equal to 0.2°, an effect of reducing the operating voltage is produced, and the effect approximately saturates at the off angle of greater than or equal to 2°. However, when the off angle is less than 0.3°, the morphology of the substrate may deteriorate as described later. Moreover, as the off angle increases, the yield of chips cut from the substrate tends to decrease. Therefore, the off angle is preferably less than or equal to 5°. The off angle may be formed in any direction. Moreover, the luminous wavelength of each of the semiconductor light emitting devices peaks at 460 nm. It is to be noted that each of the semiconductor light emitting devices of the present embodiment is a so-called light emitting diode (hereinafter referred to as LED).

Figure 2A:
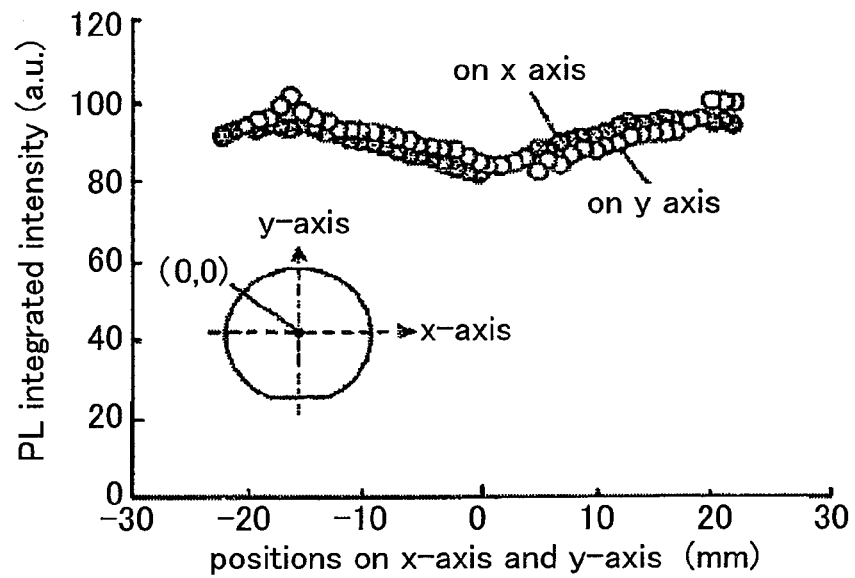
Figure 2B:
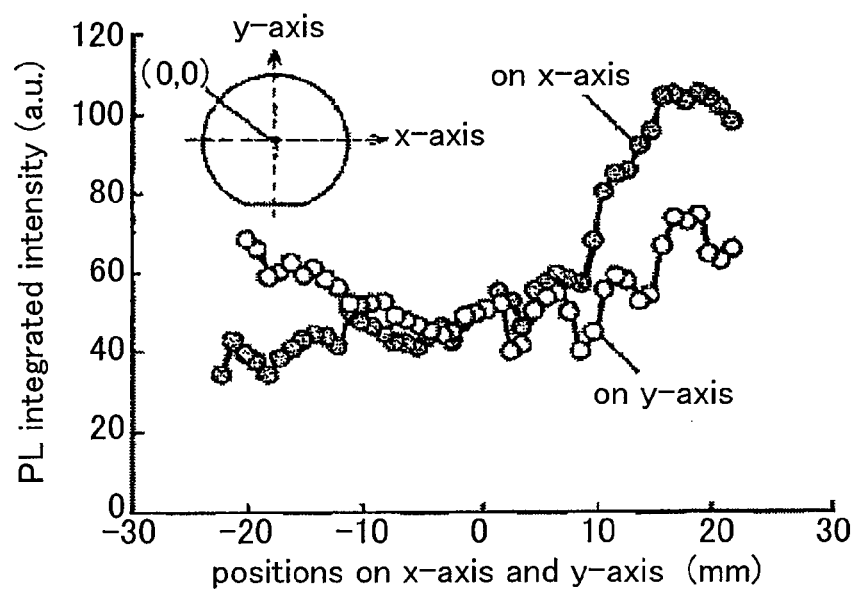

FIGS. 2A and 2B shows the relationship between the photoluminescence intensity of the semiconductor light emitting devices and formation positions of the semiconductor light emitting devices in a substrate, wherein FIG. 2A is the case where an intermediate layer made of $Ga_{0.98}In_{0.02}N$ is provided, and FIG. 2B is the case where the intermediate layer is not provided. The formation positions of the semiconductor light emitting devices in the substrate of FIG. 2 are indicated by taking the center of the substrate as the origin, arranging the x-axis parallel to an orientation flat, and arranging the y-axis vertically to the orientation flat. It is to be noted that the intermediate layer has a thickness of 50 nm.

As shown in FIG. 2B, in the case where the intermediate layer is not provided, it can be seen that the photoluminescence intensity widely varies depending on the formation positions of the semiconductor light emitting devices in the substrate. Meanwhile, as shown in FIG. 2A, in the case where the intermediate layer is provided, variations in photoluminescence intensity between the semiconductor light emitting devices is small.

From the data shown in FIG. 2, the standard deviation of luminance distribution is determined, and the variations in photoluminescence intensity are quantitatively studied. The standard deviation of luminance distribution is a standard deviation in the case where the distribution of the variations in photoluminescence intensity of the semiconductor light emitting devices with respect to a predetermined luminance value is assumed to be a normal distribution. More specifically, for example, "the standard deviation of luminance distribution has a value of 25%" means that output variations of within 25% with respect to the average of luminance are within a 1-σ distribution (68.3% of the total). It is to be noted that as an excitation light source for photoluminescence, a He-Cd laser having a wavelength of 325 nm is used.

The standard deviation of luminance distribution of FIG. 2B in the case where the intermediate layer is not provided is 33.1%, which is a very high value. Meanwhile, the standard deviation of luminance distribution of FIG. 2A in the case where the intermediate layer is provided is 5.1%, which means that the value of the standard deviation of luminance distribution is improved to be less than or equal to one sixth of that of FIG. 2B.

One reason why the above result is obtained is considered to be because six-sided pyramid shaped concavities and convexities which are specific to the GaN substrate and appear after the crystal growth of the substrate are absorbed by the intermediate layer, improving the smoothness, which allows the semiconductor layer to be stably formed. Another reason is considered to be because providing the intermediate layer exerts a stress which is to alter the shape of the substrate into a convex shape toward the crystal growth surface of the substrate, counteracting a stress which is to alter the shape of the substrate into a concave shape toward the crystal growth surface of the substrate and which is caused by lowering the temperature of a crystal surface of the substrate by a gas stream in the MOCVD apparatus, which allows the substrate to retain its flatness.

In this study, it was found that the intermediate layer 23 having a great thickness can suppress the variations in photoluminescence intensity. From the result that the variations in intensity are suppressed, it can be expected that increasing the thickness of the intermediate layer 23 further stabilizes the characteristics of the semiconductor light emitting devices.

Figure 3:
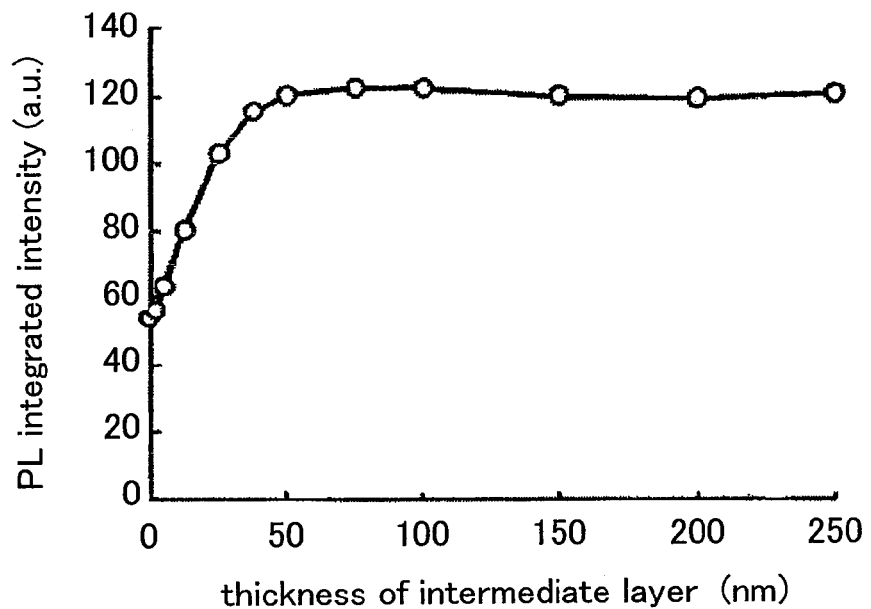
FIG. 3 is a graph illustrating the relationship between the photoluminescence intensity and the thickness of an intermediate layer of the semiconductor light emitting device according to the one embodiment of the present invention.

FIG. 3 shows the relationship between the film thickness of the intermediate layer 23 and the photoluminescence intensity. It is proved that when the intermediate layer 23 has a thickness of greater than or equal to 50 nm as shown in FIG. 3, the semiconductor light emitting device has very high photoluminescence intensity.

It is known that when the substrate made of GaN has a principal surface whose off angle is less than 0.3°, the six-sided pyramid shaped concavities and convexities are especially notably formed, deteriorating the surface morphology. However, also in this case, providing the intermediate layer 23 having a thickness of greater than or equal to 50 nm allows the semiconductor layer to be formed stably. As a result, it is possible to increase the photoluminescence intensity of the semiconductor light emitting devices and to reduce the variations in photoluminescence intensity between the semiconductor light emitting devices.

As described above, in order to increase the photoluminescence intensity of the semiconductor light emitting devices, it is preferable that the intermediate layer 23 has a great thickness. However, when the intermediate layer 23 has a great thickness, the stress which is caused by the intermediate layer 23 and which is to alter the shape of the crystal growth surface of the substrate into a convex shape may become too great, allowing the shape of the substrate to be altered into a convex shape. Moreover, when the intermediate layer 23 has a great thickness, the substrate has a great warp also after the growth of the semiconductor layer. This reduces process accuracy in a mask alignment step of an electrode formation process, a grinding step, a polishing step, and a scribing step, which may be a cause of reducing the yield of the semiconductor light emitting devices.

When the points mentioned above are considered, the intermediate layer 23 may have a thickness of 10-500 nm. When the warp of the substrate is problematic, the intermediate layer 23 has a thickness of preferably 10-100 nm, and more preferably 10-50 nm. When the substrate has an off angle of less than 0.3°, the intermediate layer 23 has a thickness of preferably 50-500 nm.

It is to be noted that the intermediate layer 23 preferably has a Si doping concentration in the range from $5 \times 10^{17} cm^{-3}$ to $1 \times 10^{19} cm-3$. This is because when the Si doping concentration of the intermediate layer 23 is less than or equal to $5 \times 10^7 cm^{-3}$, the intermediate layer 23 serves as a high-resistance layer, increasing the drive voltage, and when the Si doping concentration of the intermediate layer 23 is greater than or equal to $1 \times 10^{19} cm^{-3}$, the crystalline quality of the intermediate layer 23 deteriorates, lowering the characteristics of the semiconductor light emitting devices.

Figure 4:
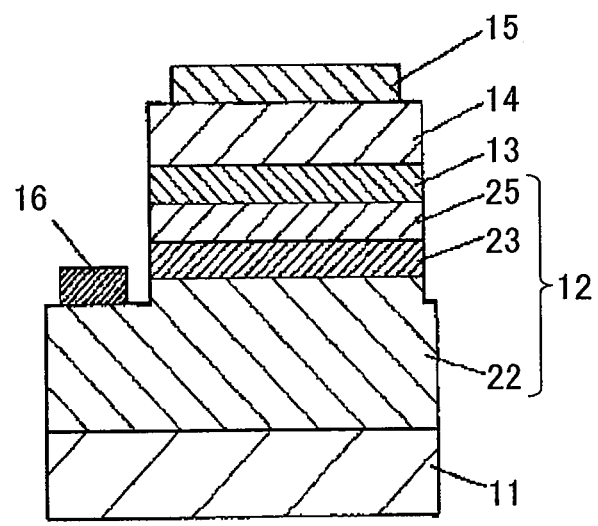
FIG. 4 is a cross-sectional view illustrating a semiconductor light emitting device according to a variation of the one embodiment of the present invention.

The present embodiment refers to an example in which the intermediate layer 23 is formed between the first n-type layer 22 and the second n-type layer 24. However, a configuration as shown in FIG. 4 may be possible in which the n-side electrode 16 is formed on the first n-type layer 22 without providing the second n-type layer 24. An example of the composition and the thickness of respective layers in this case is shown in Table 2.

TABLE 2

| | Al composition | In composition | thickness | dopant | impurity concentration ($cm^{-3}$) | others |
|---|---|---|---|---|---|---|
| GaN substrate 11 | 0 | 0 | 300 μm | — | | |
| first n-type layer 22 | 0 | 0 | 1 μm | Si | $5 \times 10^{18}$ | |
| intermediate layer 23 | 0 | x | 10-500 nm | Si | $5 \times 10^{18}$ | |
| cladding layer 25 | 0.05 | 0 | 20 nm | undoped | — | |
| active layer 13    barrier layer | 0 | 0 | 16 nm | undoped | — | |
|        well layer | 0 | 0.06 | 2 nm | undoped | — | Four well layers and three barrier layers are alternately formed on a one-by-one basis. |
| p-type layer 14 | 0.05 | 0 | 100 nm | Mg | $1 \times 10^{20}$ | |

Figure 5:
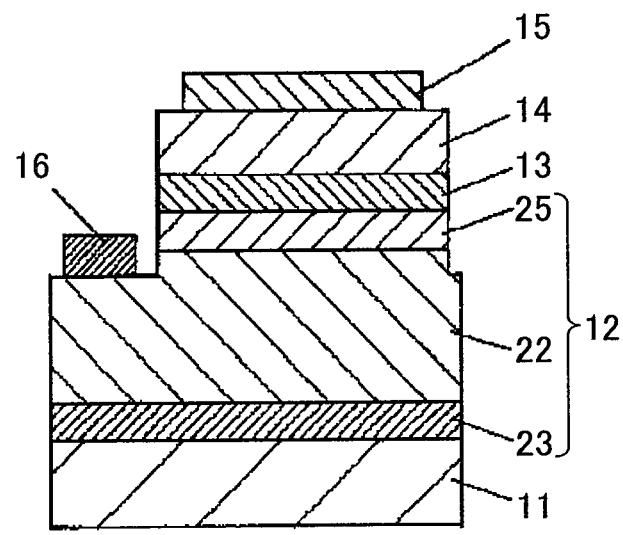
FIG. 5 is a cross-sectional view illustrating a semiconductor light emitting device according to a variation of the one embodiment of the present invention.
Figure 6:
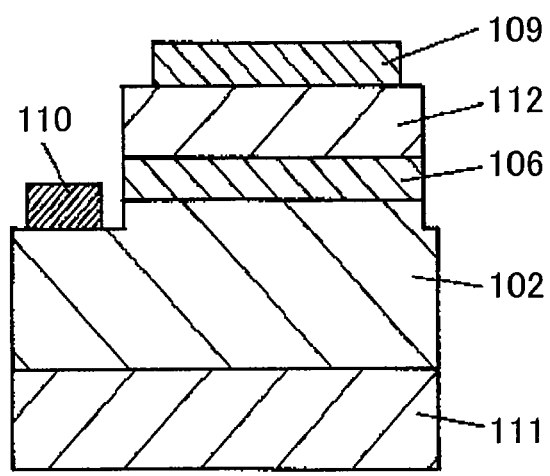
FIG. 6 is a cross-sectional view illustrating a conventional semiconductor light emitting device.

Alternatively, a configuration as shown in FIG. 5 may be possible in which the intermediate layer 23 is formed between the substrate 11 and the first n-type layer 22. An example of the composition and the thickness of each layer in this case is shown in Table 3.

TABLE 3

| | Al composition | In composition | thickness | dopant | impurity concentration (cm$^{-3}$) | others |
|---|---|---|---|---|---|---|
| GaN substrate 11 | 0 | 0 | 300 μm | — | | |
| intermediate layer 23 | 0 | x | 10-500 nm | Si | $5 \times 10^{18}$ | |
| first n-type layer 22 | 0 | 0 | 500 nm | Si | $5 \times 10^{18}$ | |
| cladding layer 25 | 0.05 | 0 | 20 nm | undoped | — | |
| active layer 13 — barrier layer | 0 | 0 | 16 nm | undoped | — | |
| active layer 13 — well layer | 0 | 0.06 | 2 nm | undoped | — | Four well layers and three barrier layers are alternately formed on a one-by-one basis. |
| p-type layer 14 | 0.05 | 0 | 100 nm | Mg | $1 \times 10^{20}$ | |

It is to be noted that the substrate 11 made of GaN may be formed in such a manner that a thick GaN layer is formed on a sapphire substrate followed by removing the sapphire substrate. Alternatively, a commercially available GaN substrate may be used. As an alternative to a sapphire substrate, a substrate allowing the crystal growth of a GaN layer made of SiC, MgAlO$_2$, or the like may be used as a substrate used for forming a thick GaN layer.

Moreover, the substrate 11 is not limited to a substrate made of GaN. A substrate made of another group III-V nitride semiconductor such as AlGaN, GaInN, or the like can provide the same effects.

Although each embodiment has been described with reference to the LED, a semiconductor laser device using a group III-V nitride semiconductor other than the LED can provide the same effects.

INDUSTRIAL APPLICABILITY

According to semiconductor light emitting devices of the present invention, it is possible to suppress variations between the semiconductor light emitting devices formed on a substrate made of a group III-V nitride semiconductor, so that the semiconductor light emitting devices having stable characteristics can be realized. Therefore, the semiconductor light emitting devices of the present invention are useful as semiconductor light emitting devices made of a group III-V nitride semiconductor or the like.

The invention claimed is:

1. A semiconductor light emitting device comprising:
a substrate made of a group III-V nitride semiconductor;
a first-conductivity-type layer formed on the substrate, the first-conductivity-type layer including a plurality of group III-V nitride semiconductor layers of first conductivity type;
an active layer formed on the first-conductivity-type layer; and
a second-conductivity-type layer formed on the active layer, the second-conductivity-type layer being made of a group III-V nitride semiconductor layer of second conductivity type;
wherein the first-conductivity-type layer includes an intermediate layer made of Ga$_{1-x}$In$_x$N(0<x<1),
part of the first-conductivity-type layer, the active layer, and the second-conductivity-type layer form a mesa portion, and
the part of the first-conductivity-type layer which forms the mesa portion is a part excepting at least the intermediate layer.

2. The semiconductor light emitting device of claim 1, wherein the intermediate layer is in contact with the substrate.

3. The semiconductor light emitting device of claim 1, wherein the intermediate layer has a thickness of 10-500 nm.

4. The semiconductor light emitting device of claim 1, wherein a principal surface of the substrate is a (0001) plane.

5. The semiconductor light emitting device of claim 1, wherein a principal surface of the substrate has an off angle of 0.3-5° from a (0001) plane.

6. The semiconductor light emitting device of claim 1, wherein
a principal surface of the substrate has an off angle of less than 0.3° from a (0001) plane, and
the intermediate layer has a thickness of 50-500 nm.

* * * * *